US011977105B2

(12) United States Patent
Sargsyan

(10) Patent No.: US 11,977,105 B2
(45) Date of Patent: May 7, 2024

(54) CURRENT AND VOLTAGE MEASURING UNIT

(71) Applicant: SORAYTEC SCANDINAVIA, Skien (NO)

(72) Inventor: Harutyun Sargsyan, Yerevan (AM)

(73) Assignee: SORAYTEC SCANDINAVIA, Skien (NO)

( * ) Notice: Subject to any disclaimer, the term of this patent is extended or adjusted under 35 U.S.C. 154(b) by 364 days.

(21) Appl. No.: 17/425,861

(22) PCT Filed: Jan. 16, 2020

(86) PCT No.: PCT/EP2020/051066
§ 371 (c)(1),
(2) Date: Jul. 26, 2021

(87) PCT Pub. No.: WO2020/156826
PCT Pub. Date: Aug. 6, 2020

(65) Prior Publication Data
US 2022/0187347 A1    Jun. 16, 2022

(30) Foreign Application Priority Data

Jan. 28, 2019    (CH) .................................... 00089/19

(51) Int. Cl.
*G01R 21/08*    (2006.01)
*G01R 15/14*    (2006.01)
(Continued)

(52) U.S. Cl.
CPC ........... *G01R 21/08* (2013.01); *G01R 15/142* (2013.01); *G01R 15/181* (2013.01);
(Continued)

(58) Field of Classification Search
CPC ........................... G01R 15/142; G01R 15/181
See application file for complete search history.

(56) References Cited

U.S. PATENT DOCUMENTS

| 2011/0172938 A1* | 7/2011 | Gu ....................... G01R 15/202 |
| | | 324/629 |
| 2014/0266240 A1* | 9/2014 | Haensgen ............. H02J 50/001 |
| | | 307/104 |
| 2018/0143234 A1 | 5/2018 | Saxby |

FOREIGN PATENT DOCUMENTS

WO    WO 2011/063851 A1    6/2011

OTHER PUBLICATIONS

International Search Report, issued in PCT/EP2020/051066, dated Apr. 6, 2020.
(Continued)

*Primary Examiner* — Reena Aurora
(74) *Attorney, Agent, or Firm* — Birch, Stewart, Kolasch & Birch, LLP

(57) ABSTRACT

A measuring unit for simultaneous measurement of two current values and two voltage values of a power line with three high-voltage conductors includes: three two-pole electrical interconnections, each interconnection being configured to be connected between two separated ends a high-voltage conductors; a first and second current sensor, configured and arranged to measure a current through the first interconnection and through the third interconnection respectively; and a first and second voltage sensor, configured and arranged to measure a voltage between the first and second interconnection and between the second and third interconnection. The measurement of the two current values and the two voltage values is at a floating potential. This measuring unit may be installed directly on all three phases, of a substation for example, with its own internal power source and with no ground connection. Such features are important for power systems with high penetration of variable renewable energy resources such as solar PV or wind.

15 Claims, 2 Drawing Sheets

Figure 1:
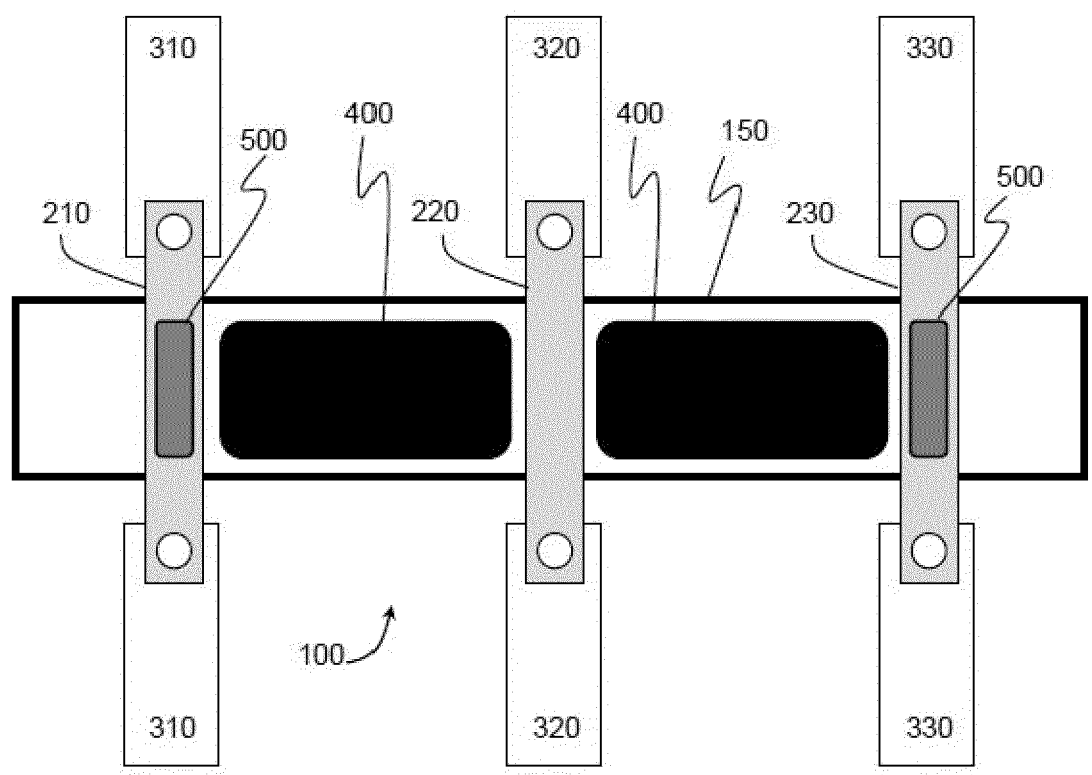

(51) Int. Cl.
- *G01R 15/18* (2006.01)
- *G01R 15/20* (2006.01)
- *G01R 31/08* (2020.01)

(52) U.S. Cl.
CPC ......... *G01R 15/202* (2013.01); *G01R 15/207* (2013.01); *G01R 31/088* (2013.01)

(56) References Cited

OTHER PUBLICATIONS

Written Opinion of the International Searching Authority, issued in PCT/EP2020/051066, dated Apr. 6, 2020.

\* cited by examiner

CURRENT AND VOLTAGE MEASURING UNIT

The present invention relates to a current and voltage measuring unit for measuring current and voltage values of a three-phase high-voltage line without neutral or ground line connection.

There is a growing need for smart meters (measuring units) to collect, process and transmit vital energy information of power transmission and distribution systems in an accurate and reliable way. Power generation is becoming more diverse as renewable energy becomes more widely available—the traditional model of a few large producers and a multiplicity of consumers is rapidly shifting to a network of micro-generators. These micro-generators must be registered and integrated into the system—smart meters can help with calculating the energy supplied, ensuring a correct degree of compensation and tracing down sources of problems such as faults, short-circuits, power spikes, unbalanced loads and a drop in power quality. Current smart meters are often difficult to install, often due to the clamps that must be clipped around the conductors to measure current—several different diameters must be provided to reduce the risk that the diameter is unsuitable. Furthermore, current smart meter using clamps have often issues in terms of insulation capability between the phases and safety.

Alternative solutions for performing metering require a set of additional equipment including current and voltage transformers to be installed before smart meters to mitigate technological limitations. The very large number of distribution systems, particularly in the medium to high voltage range from 6/10 kV to 50 kV, means that the cost of metering systems is a major barrier to adopting this useful technology.

The objective of the present invention is to provide a novel current and voltage measuring unit, which overcomes the disadvantages described above. Especially, it is an objective of the present invention to provide a novel current and voltage measuring unit that does not use clamps for connecting to the power line.

A measuring unit is provided for simultaneous measurement of two current values and two voltage values of a power line, the power line including a first, second and third high-voltage conductor configured to provide three-phase power, the measuring unit comprising a first, second and third two-pole electrical interconnections, each interconnection being configured to be connected between two separated ends of the first, second and third high-voltage conductors respectively, the two poles of each electrical interconnection being electrically connected to each other; a first and second current sensor, configured and arranged to measure a current through the first interconnection and through the third interconnection respectively; and a first and second voltage sensor, configured and arranged to measure a voltage in range of 0 to 50 kV between the first and second interconnection and between the second and third interconnection; the measuring unit being further configured and arranged to measure each of the two current values and each of the two voltage values at a floating potential.

By measuring current and voltage at a floating potential, no ground connection or ground reference is required. This is advantageous because it may simplify installation, and may provide a greater resistance to power spikes in the power line (for example, due to lightning).

By measuring two current values and two voltage values simultaneously, an accurate and precise evaluation of the parameters of the power line may be provided. By connecting the interconnections between the separated ends of the high-voltage conductor, installation problems due to clamps may be reduced. The direct placement of the measuring unit means that there is no practical limitation in the wire size diameter of the high-voltage conductors. Measurement of both medium- and high-voltage lines may be performed by installing the measuring unit in substations or on power lines.

Furthermore, a measurement unit without clamps allows for more accurate measurements, since it is configured as an integrated circuit with physical connections to the power lines. Moreover, the measuring unit according to the present invention is more accurate than a measuring unit using clamps which is deriving its measurement from magnetic field, since it measures directly the actual values of current and voltages. The stability and reliability of connection of the measurement unit according to the present invention compared to a system employing clamps is higher, since it can be bolted to the power lines. In events of high current spikes or heavy weather, or any other type of physical force, there is no or less risk of disconnection.

In a first preferred embodiment of the present invention, the current sensor is a shunt sensor for current measurement in a range of 0 A to 200 A, a Hall sensor for current measurement in a range of 0 A to 1000 A, a Rogowski coil current sensor for current measurement in a range of 0 A to 100 kA, especially for current measurement above 200 A, particularly above 500 A, or a current transformer, as for instance a nano-core current transformer, for current measurement in a range of 0 A to 500 A. By using two-pole electrical interconnections instead of clamps shunt measurement is possible for current. A shunt has a higher EMC electromagnetic compatibility, i.e. it is more resilient towards electrical noise/disturbances, which can come from the switchgear or other parts of the electrical network. By using Hall sensors instead of shunts for current measurement, larger currents may be measured allowing installation of the measuring unit according to the invention instead of the conventional plurality of devices currently used at substations for power and energy metering, which conventionally includes three step-down voltage transformers (one per high-voltage conductor), two or three current transformers (one per high-voltage conductor) and a low-voltage metering system. This may simplify installation, it may reduce the overall costs and may increase reliability due to the reduction in complexity.

In another preferred embodiment of the present invention, the first, second and third two-pole electrical interconnections are rigid electrical conductive rods or slabs, especially rigid rods or slabs made out of metal, preferably rigid rods or slabs made out of copper or aluminum or any other conductive alloys. By using rigid rods or slabs, the measuring unit of the present invention becomes very rigid allowing the accurate measurement of current and/or voltage even if the unit is subjected to high mechanical forces. This allows also diminishing the risk of disconnection of the measuring unit from the power line.

In a further embodiment, a measuring unit is provided being further configured and arranged to be powered directly (self-powered) from the high-voltage line and/or powered by a magnetic field and/or powered by an internal power source. Installation and operation are simplified as no external power source is required. In addition, during periods in which the energy flow in the power line is interrupted, monitoring may still be continued if a battery, or rechargeable battery, is provided.

In a still further embodiment, a measuring unit is provided wherein the first voltage sensor, the second voltage sensor, the first current sensor and second current sensor are comprised in a high-voltage circuit; and the unit further comprises a low-voltage circuit, coupled to the high-voltage circuit, such that the two current values are detectable by the low-voltage circuit and the low-voltage circuit is powered by the high-voltage circuit. By dividing the components into those operating at a high-voltage and those operating at a low voltage, the electrical insulation may be optimized by covering the high-voltage components. In addition, more flexibility is provided as either module may be upgraded, repaired and/or replaced.

In another embodiment, a measuring unit is provided further comprising a data communications interface for radio and/or galvanically separated communication with a base station. A data communications interface allows an easier integration into existing networks (Ethernet, 2G/3G/4G/5G mobile modem, RS-485 etc.) to simplify data collection. The data may then be used for monitoring and post-processing. The data communications interface may also be configured for full two-way communication, allowing the user to configure the measuring unit remotely.

In yet another embodiment, a measuring unit is provided further comprising a third current sensor, configured and arranged to measure a current through the second interconnection, wherein the third current sensor is a shunt sensor for current measurement in a range of 0 A to 200 A, a Hall sensor for current measurement in a range of 0 A to 1000 A, a Rogowski coil current sensor for current measurement in a range of 0 A to 100 kA, especially for current measurement above 200 A, particularly above 500 A, or a current transformer, as for instance a nano-core current transformer, for current measurement in a range of 0 A to 500 A. This provides a third current values which may be measured simultaneously with the other two current values and the two voltage values. This provides additional information about the energy carried by the second high-voltage conductor.

In still another embodiment, a measuring unit is provided that is further configured and arranged to detect and indicate faults and/or a short circuit in at least one high-voltage conductor. By providing a measurement IC and/or a digital processor, a flexible system is provided that may be configured to provide improved monitoring and fault detection. The measuring unit may be further configured and arranged to measure reactive currents and/or reactive power and/or harmonics of at least one high-voltage conductor.

In a further embodiment, a measuring unit is provided which is further configured and arranged to generate an interrupt signal in case of a fault indication, the interrupt signal being configured and arranged to trigger a safety relay, the safety relay being configured and arranged to interrupt a flow of electrical energy to at least one high-voltage conductor. Again, by providing a measurement IC and/or a digital processor, a flexible system is provided that may be configured to provide improved monitoring and fault detection. In addition, the unit may be configured to trigger a safety relay—this may be comprised in the unit itself, configured to interrupt the flow of energy through one or more of the interconnections. The relay may also be located outside the unit, configured and arranged to interrupt the flow of energy through one or more of the high-voltage conductors.

In yet another embodiment, the unit comprises a waveform extracting module. Monitoring and analysis of power-line waveforms can be a vital diagnostic tool for identifying problem conditions on a power system before they can cause disturbances or interruptions. Signal analysis techniques such as the periodogram and spectrogram or phasor measurement can be employed to analyze power-line voltage and current variations. The waveform extracting module is especially used for automatically acquiring the power-line voltage and current waveform.

In a further embodiment, the waveform extracting module is configured for power quality analyzing. The waveform extracting module is especially configured to monitor variations in the peak and/or RMS voltage, to detect peaks or sags in the voltage waveform, to monitor variations in frequency or deviations of the waveform from a predetermined ideal waveform as for example a sine or cosine waveform or detect variations in the amplitude of the waveform to prevent overvoltage created for example by renewable energy sources.

In a further embodiment, the waveform extracting module is configured for detecting and characterizing a ground fault, a phase-to-phase fault and/or any type of waveform distortion, such as sags or spikes. By detecting and characterizing these events, it is possible to determine for instance if insulation breakdown has occurred or a short circuit or ground connection was created for example by a tree which has fallen on to the overhead voltage line or a broken cable in an underground voltage line.

In yet another embodiment, the waveform extracting module is configured for localizing the detected event within the network. By using a waveform extracting module configured for localizing the detect event within the network, the defective component or part of the network can be replaced or repaired more quickly or isolated to prevent large scale black or brown outs. By analyzing the time, a fault signal between two devices is recorded by each of them the point of fault can be localized from the delta in time it took to be recorded by both the devices. In the case of only one device the location of the fault can be calculated by using the waveform characteristics in combination with the travelling speed of the signal within the conductive medium (powerline).

In a further embodiment, the unit comprises a data collection module for collecting data related to total harmonic distortion of voltage and/or current, especially supra harmonics. By detecting sources and magnitude of harmonic or supra harmonic distortion existing assets and components along the power network can be used to absorb or cancel the negative effect of the distortion or additional equipment such as low or high pass or bandwidth filters can be installed to reduce or eliminate the distortion. By monitoring distortion levels grid capacity and upgrades can be planned more accurately and economical.

A brief description of the Figures is given below.

FIG. 1: Schematic representation of the mechanical construction of the current and voltage measuring unit according to the invention.

Figure 2:
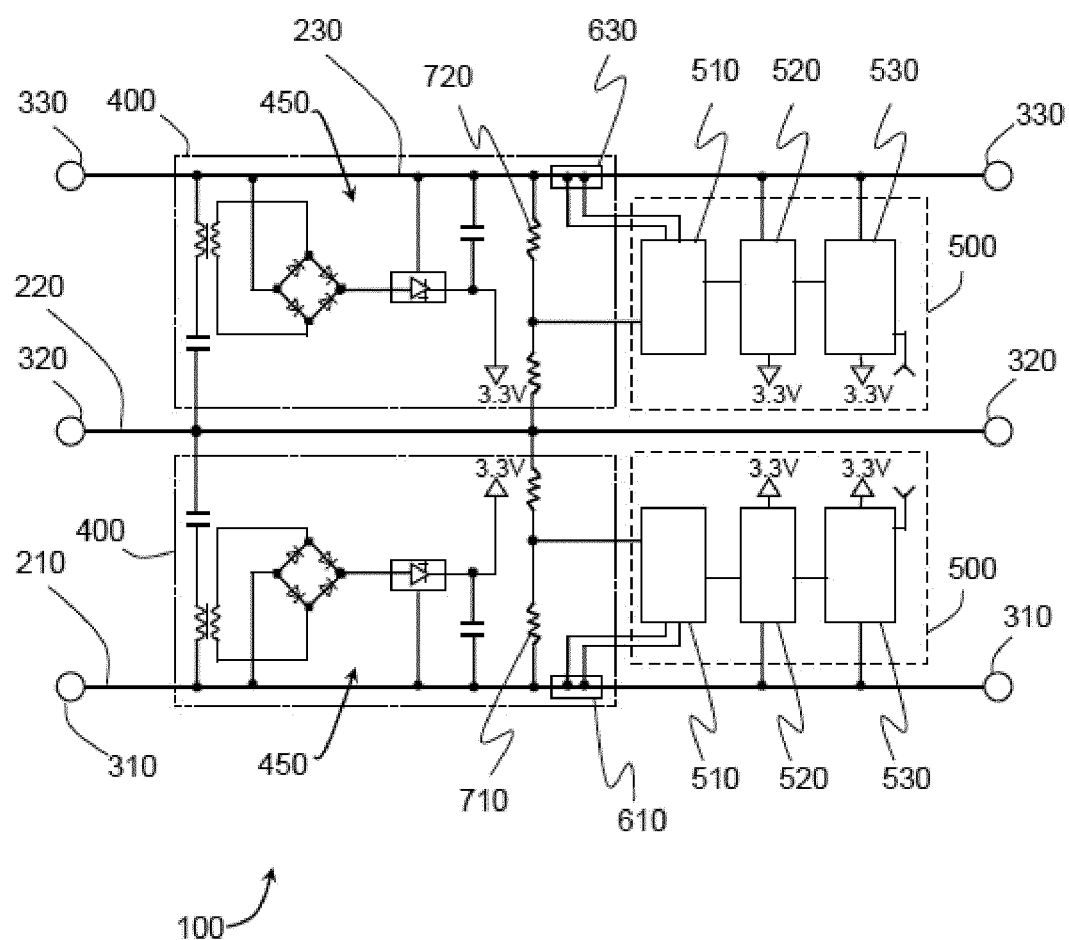

FIG. 2: Schematic circuit diagram for the current and voltage measuring unit according to the invention.

The invention is exemplified in the following embodiments.

FIG. 1 shows an example of the mechanical construction of the current and voltage monitoring unit 100 in accordance with the invention. The unit 100 is arranged to simultaneously measure two current values and two voltage values of three high-voltage conductors 310, 320, 330, configured to provide three phase power over a power line—each one of the conductors 310, 320, 330 carries a phase of the three-phase electrical energy.

To fit the unit 100, each of the three high-voltage conductors 310, 320, 330, is separated, providing two ends. The unit 100 comprises three two-pole electrical interconnections 210, 220, 230—the two poles of each electrical interconnection 210, 220, 230 are electrically connected to each other.

The two poles of the first interconnect 210 are electrically connected between the two separated ends of the first high-voltage conductor 310. Similarly, the two poles of the second interconnect 220 are electrically connected between the two separated ends of the second high-voltage conductor 320, and two poles of the third interconnect 230 are electrically connected between the two separated ends of the second high-voltage conductor 330.

The use of first, second and third for the interconnections 210, 220, 230 and the conductors 310, 320, 330 does not imply that a certain phases is connected to a particular interconnection. It also does not imply a certain order for the phases, or a relative phase relationship between adjacent conductors.

The measuring unit 100 is configured and arranged to measure two current values and two voltage values simultaneously at a floating potential—in other words, no electrical connection is made with a high-voltage conductor designated as a neutral in the three-phase power scheme. In addition, no electrical connection is made with an earth (or a ground). This makes the unit 100 easier to install, and may provide more resistance against power spikes in the power line (for example, due to lightning).

The unit 100 depicted in FIG. 1 comprises:
- an insulating housing 150. The degree and type of insulation 150 depends on the electrical energy which may be present on at least one of the high-voltage conductors 310, 320, 330. This may be up to 50 kV, although a lower rated voltage, such as 3 kV, 3.3 kV, 6 kV, 6.6 kV, 10 kV, 11 kV, 12 kV, 20 kV, 22 kV, 24 kV, 33 kV, or 35 kV may be present. Preferably, the unit 100 and the insulating housing 150 are configured and arranged to comply with the IEC 60071-1:2006+AMD1:2010 CSV insulation requirements standard.
- a first current sensor (not depicted in FIG. 1), configured and arranged to measure a current through the first interconnection 210. Also a second current sensor (not depicted in FIG. 1), configured and arranged to measure a current through the third 230 interconnection. The current sensors may be a shunt sensor, a Hall sensor, a Rogowski coil current sensor or a current transformer, as for instance a nano-core current transformer:
  - a shunt sensor comprises a high power, low Ohm resistor mounted in series between the two poles of the interconnection 210, 230 where the current is to be sensed and then measured. The unit 100 is configured and arranged to measure current values in a range of 0 A to 200 A;
  - a Hall-effect based sensor (or Hall sensor) is configured and arranged to sense a magnetic field created as current flows between the two poles of the interconnection 210, 230 where the current is to be sensed and then measured. The Hall sensor may be mounted in close proximity to any portion of the interconnection 210, 230. Optionally, a ferromagnetic element, such as a C-core, may be used to increase the magnetic field strength close to the Hall sensor. Hall sensors are also available with an Integrated Magnetic Concentrator (IMC), allowing direct mounting on a surface of the interconnection 210, 230 where current is to be sensed. The unit 100 is then configured and arranged to measure current values in a range of 0 A to 1000 A, preferably in the range 5 A to 1000 A, more preferably in the range 100 A to 1000 A, most preferably in the range 200 A to 800 A.

Hall-effect based sensors have in general very good linearity in upper region of current range, while suffering from noticeable non-linearity in the lowest/lower current region. For example, from 25 A to 600 A, a sensor may have 0.2% accuracy. However, as the current drops below 15 A, inaccuracies increase significantly. Some modern sensors may already have a degree of compensation. For higher accuracies, the sensor may be calibrated in this low current region against a reference, generating a look-up table or correction formula. If the unit 100 further comprises a processor, the processor may be configured to provide the necessary correction.

The unit 100 depicted in FIG. 1 further comprises:
- a first voltage sensor (not depicted in FIG. 1), configured and arranged to measure a voltage in a range of 0 to 50 kV between the first 210 and second 220 interconnection. A second voltage sensor (not depicted in FIG. 1) is also provided, configured and arranged to measure a voltage in a range of 0 to 50 kV between the second 220 and third 230 interconnection, preferably in a range of 1 kV to 50 kV, more preferably 5 kV to 45 kV, most preferably 5 kV to 22 kV.

The invention is based on the insight that in many cases, it is sufficient to measure only two voltages and two current simultaneously to get a precise measurement of the status of the energy flow through the power line. In many cases, it is also not necessary to measure with respect to a ground or neutral to get a precise measurement of the status.

Optionally, the electronic circuitry comprised in the unit 100 may be separated into one or more high-voltage circuits 400 and one or more low-voltage circuits 500. A high-voltage circuit 400 comprises at least one direct electrical connection for power from a component or device to at least one high-voltage carrying interconnection 210, 220, 230. A low-voltage circuit 500 comprises no direct connection for power.

In general, a high-voltage circuit 400 requires a higher degree of insulation. By dividing the circuitry into one or more high-voltage circuit 400 and one or more low-voltage circuit 500, less insulation for the unit 100 as a whole is required because the components of the low-voltage circuit 500 need less insulation.

Additionally or alternatively, dividing the circuitry into two modules (circuits) provides more flexibility in how the circuits are arranged. For example, a high-voltage circuit 400 may be mounted in the space between two adjacent interconnections 210, 220, 230 and a low-voltage circuit 500 may be mounted immediately above or below an interconnection 210, 220, 230.

Simultaneous measurement of two current values and two voltage values of the three high-voltage conductors 310, 320, 330 provide accurate and complete three-phase power measurement is done by using the Aron-circuit method or "two power-meter method".

The two measured current values are
- currents passing through the first high-voltage conductor 310 (in most cases the same current will pass through the first interconnection 210); and currents passing through the second high-voltage conductor 330 (in most cases the current through the third interconnection 230).

The two measured voltages are:

the voltage between the first high-voltage conductor 310 and the second high-voltage conductor 320 (in most cases, the voltage between the first interconnection 210 and the second interconnection 220); and the voltage between the third high-voltage conductor 330 and the second high-voltage conductor 320 (in most cases, the voltage between the third interconnection 230 and the second interconnection 220).

From these values, the total three-phase active, reactive and/or apparent power may be calculated. Additionally or alternatively, the active, reactive, and/or apparent energy may be calculated.

FIG. 2 depicts a simplified electrical schematic of the current and voltage monitoring unit 100 in accordance with the invention.

The circuitry may be comprised in a single circuit, or optionally it may be separated into a high-voltage circuit 400 and a low-voltage circuit 500.

It may also be advantageous to provide more than one high-voltage circuit 400 and more than one low-voltage circuit 500—by taking advantage of the modularity, it may be easier to reconfigure, upgrade or repair an existing unit 100, or to provide customized units 100. For example, the high-voltage circuit 400 includes both the current and voltage sensors. If a higher accuracy class is required, it may be sufficient to only replace the high-voltage circuit 400. The low-voltage circuit 500 may be retained.

In the example depicted, the unit 100 comprises two high-voltage circuits 400 and two low-voltage circuits 500—as depicted, there is a first high-voltage 400/low-voltage circuit 500 electrically connected to the first 210 and second 220 interconnect. There is also a second high-voltage 400/low-voltage circuit 500 connected to the third 230 and second 220 interconnect. The electrical connections to the high-voltage conductors 310, 320, 330 are the same as depicted in FIG. 1—however, for clarity, only the two poles are shown for each interconnection 210, 220, 230. These poles are connected, in use, to the separated ends of the high-voltage conductors 310, 320, 330 as depicted in FIG. 1. The first high-voltage 400/low-voltage circuit 500 and second high-voltage 400/low-voltage circuit 500 are depicted as substantially identical. However, they may be separately configured and arranged to, for example to optimize the measurements being performed—where an alternative is given below, each high voltage 400/low voltage circuit 500 may comprise the same option or a different option.

Each high-voltage circuit 400 comprises:

a power supply 450, configured and arranged to convert electrical energy from at least one interconnection 310, 320, 330 to a voltage suitable for powering the components and devices comprised in the low-voltage circuit 500.

This energy comes from the three-phase power-line, and results in the unit 100 being self-powered. As depicted, a rectifier bridge and Zener diode may be used to provide a DC voltage of approximately 3.3V. However, any suitable voltage may be provided as DC and/or AC, such as +/−5V, +/−6V, +/−9V, +/−12V. More than one voltage may also be generated by the power supply.

More specifically, the first high-voltage circuit 400 is connected between the first 210 and second 220 interconnections. The power supply 450 converts electrical energy from the second interconnection 220 relative to the first 210 interconnection to the voltage, here 3.3V. This voltage for the low-voltage circuit 500 is 3.3 V with respect to the voltage on the first 210 interconnection.

Similarly, the second high-voltage circuit 400 is connected between the third 230 and second 220 interconnections. The power supply 450 converts electrical energy from the second interconnection 220 relative to the third 230 interconnection to the voltage, here 3.3V. This voltage for the low-voltage circuit 500 is 3.3 V with respect to the voltage on the third 230 interconnection.

Additionally or alternatively, an internal power source, such as a battery, may be provided. This allows for uninterrupted monitoring even if the power line is down (that is, if the electrical energy flow is interrupted).

It may be advantageous to provide a rechargeable battery, and a power supply 450 configured and arranged to provide a voltage and/or current suitable for charging the battery.

Additionally or alternatively, the power supply 450 may be configured to convert magnetic energy generated by current flowing through at least one interconnection 310, 320, 330.

a current sensor as described above for FIG. 1. For this example, either:

the first current sensor 610, configured and arranged to sense and measure the current through the first interconnection 210, comprised in the first high-voltage circuit 400; or the second current sensor 630, configured and arranged to sense and measure the current through the second interconnection 230, comprised in the second high-voltage circuit 400;

a voltage sensor as described above for FIG. 1. For this example, either: the first voltage sensor (710), configured and arranged to measure a voltage in a range of 0 to 50 kV between the first 210 and second 220 interconnection, comprised in the first high-voltage circuit 400; or the second voltage sensor (730) is also provided, configured and arranged to measure a voltage in a range of 0 to 50 kV between the third 230 and second 220 interconnection, comprised in the second high-voltage circuit 400.

As depicted, a voltage divider may be provided, such that the central connection between the two resistors of the divider provides a signal having a known relationship with the actual voltage difference between the first 210 and second 220 interconnections (for the first high-voltage circuit 400), or the third 230 and second 220 interconnections. In the case of a divider, the signal is a voltage signal, greatly reduced in amplitude, which resembles the voltage measured between the interconnections 210 and 220 or between 230 and 220.

The signal representing the voltage difference is provided to the low-voltage circuit 500 for measurement.

Each low-voltage circuit 500 comprises:

a measurement IC 510 or Energy Measurement Processor (EMP).

This receives power from the high-voltage circuit 400 power supply 450, receives a signal from the voltage sensor 710, 730 and a signal from the current sensor 610, 630, and is in communication with a processor 520.

The components and devices in the low-voltage circuit 500 are also powered at a floating potential. In the first low-voltage circuit 500, the power from the power supply 450 is provided with respect to the first interconnection 210.

In the second low-voltage circuit 500, the power from the power supply 450 is provided with respect to the third interconnection 230.

the digital processor 520 or Microcontroller Unit (MCU).

This receives power from the high-voltage circuit 400 power supply 450—in the first low-voltage circuit 500, the power is provided with respect to the first interconnection 210. In the second low-voltage circuit 500, the power is provided with respect to the third interconnection 230.

The digital processor 520 is in communication with the measurement IC 510 and an optional data communications interface 800. The processor 520 may optionally comprise digital memory storage. The processor 520 may be configured to control and provide, for example:

- fixed, variable and/or regular current and voltage measurement intervals—harmonics measurement of at least one high-voltage conductor 310, 320, 330
- detect and indicate a short circuit in at least one high-voltage conductor 310, 320, 330
- threshold monitoring and/or alarms
- fault detection and indication—optionally, the measurement unit 100 may further comprise a fault passage indicator.
- triggering of one or more safety relays to interrupt a flow of electrical energy to at least one high-voltage conductor 310, 320, 330
- data intensive processing, such as post-processing, load profiling, time of use, and dead line analysis
- the optional data communications interface 800.

This receives power from the high-voltage circuit 400 power supply 450—in the first low-voltage circuit 500, the power is provided with respect to the first interconnection 210. In the second low-voltage circuit 500, the power is provided with respect to the third interconnection 230.

The data communications interface 800 is in communication with the processor 520. In addition, it is configured and arranged to communicate with a further unit (not depicted) such as a base station and/or a remote monitoring unit and/or a remote-control unit. Advantageously, it is configured to be compatible with one or more common industrial interfaces. Wired networks such as RS-485, RS-232 and/or Ethernet or others (such as PROFIBUS) may be used. A form of galvanically separated communication may also be used, such as optical or radio. Wireless networks may also be used, such as GSM, Bluetooth, and/or Wi-Fi. This allows smart metering to be used effectively.

Optionally, two-way communication may be provided, allowing the unit 100 to be controlled and/or configured remotely.

A further advantage of a separate low-voltage circuit 500 is that it may be replaced separately from the high-voltage circuit 400, which may save time and may be cheaper. This is particularly advantageous when the user upgrades or modifies their network. For example, from a cabled network to a wireless network.

As described, the measuring unit 100 may be configured to trigger a safety relay—this may be comprised in the unit 100 itself, configured to interrupt the flow of energy through one or more of the interconnections 210, 220, 230. The relay may also be located outside the unit, configured and arranged to interrupt the flow of energy through one or more of the high-voltage conductors 310, 320, 330.

Optionally, the unit 100 may further comprise a third current sensor 620, configured and arranged to measure a current through the second interconnection 220. Similar to the first 610 and second 620 current sensors, the third current sensor 620 may be a shunt sensor for current measurement in a range of 0 A to 200 A, a Hall sensor for current measurement in a range of 0 A to 1000, a Rogowski coil current sensor for current measurement in a range of 0 A to 100 kA, especially for current measurement above 200 A, particularly above 500 A, or a current transformer, as for instance a nano-core current transformer, for current measurement in a range of 0 A to 500 A.

In summary, a current, voltage, power and energy integrated measurement unit 100 is provided which performs precise (0.05% to 1% accuracy) measurement of these electrical parameters in a single device of medium- and high-voltage power lines or substations, at rated voltages of 3 kV and above, preferably 6 kV and above.

The measurement unit 100 may be installed directly on all three phases, of a substation for example, with its own internal power source and with no ground connection. The actual measurements are done between the phases. Current may be measured using a Hall sensor a shunt sensor, a Rogowski coil current sensor or a current transformer, as for instance a nano-core current transformer. Voltage may be measured using a voltage divider. All sensors and electronics are powered by the internal power source. Based on high accuracy, the device may perform both commercial energy metering and measurements/monitoring of electrical parameters for technical purposes (e.g. voltage or current variations). Such features are important for power systems with high penetration of variable renewable energy resources such as solar PV or wind.

Preferably the measuring unit 100 complies with one or more of the modern substation equipment IEC standards, including most critical BIL tests (currently up to 22 kV equipment).

For example:
- the IEC 60071-1:2006+AMD1:2010 CSV insulation requirements standard;
- the IEC 60060-3:2006 or the IEC 60060-2:2010 high-voltage test techniques standard for specified voltage levels as per the IEC 60060-1: 2006 standard;
- the IEC 62475:2010 high-current testing standard;
- measure the two current values in compliance with the IEC 61869-2:2012 accuracy class 0.5 S or 0.2 S standard and IEC 62053-22 as defined in "Electricity metering equipment (a.c.)—Particular Requirements—Part 22: Static meters for active energy (classes 0,2 S and 0,5 S)" from year 2003; and/or
- measure the two voltage values in compliance with the IEC 61869-3:2012 accuracy class 0.5 or 0.2 standard and IEC 62053-22 as defined in: "Electricity metering equipment (a.c.)—Particular Requirements—Part 22: Static meters for active energy (classes 0,2 S and 0,5 S)" from year 2003.
- in general complies with the IEC 61869 family for instrument transformers and IEC 62271200:2011, for AC metal-enclosed switchgear and control gear for rated voltages above 1 kV and up to and including 52 kV.

It may also be advantageous to measure a further voltage: the voltage between the first high-voltage conductor 310 and the third high-voltage conductor 330 (in most cases, the voltage between the first interconnection 210 and the third interconnection 230).

Drawing Reference Numbers

| | |
|---|---|
| 100 | Measuring unit |
| 150 | Insulating housing |

-continued

| Drawing Reference Numbers | |
|---|---|
| 210 | First electrical interconnection |
| 220 | Second electrical interconnection |
| 230 | Third electrical interconnection |
| 310 | First high-voltage conductor |
| 320 | Second high-voltage conductor |
| 330 | Third high-voltage conductor |
| 400 | High-voltage circuit |
| 450 | Power supply |
| 500 | Low-voltage circuit |
| 510 | Measurement IC |
| 520 | Processor |
| 530 | Data communications interface |
| 610 | First current sensor |
| 620 | Third current sensor |
| 630 | Second current sensor |
| 710 | First voltage sensor |
| 720 | Second voltage divider |
| 800 | Data transmission interface |
| 900 | Base station |

The invention claimed is:

1. A measuring unit for simultaneous measurement of two current values and two voltage values of a power line, the power line including a first, second and third high-voltage conductor configured to provide three-phase power, the measuring unit comprising:
a first, second and third two-pole electrical interconnections, each interconnection being configured to be connected between two separated ends of the first, second and third high-voltage conductors respectively, the two poles of each electrical interconnection being electrically connected to each other;
a first and second current sensor, configured and arranged to measure a current through the first interconnection and through the third interconnection respectively; and
a first and second voltage sensor, configured and arranged to measure a voltage in a range of 0 to 50 kV between the first and second interconnection and between the second and third-interconnection,
wherein the measuring unit is configured and arranged to measure each of the two current values and each of the two voltage values at a floating potential, wherein no electrical connection is made with a high-voltage conductor designated as a neutral and no electrical connection is made with a ground.

2. The measuring unit according to claim 1, wherein the first current sensor and/or the second current sensor is a shunt sensor for current measurement in a range of 0 A to 200 A, a Hall sensor for current measurement in a range of 0 A to 1000 A, a Rogowski coil current sensor for current measurement in a range of 0 A to 100 kA, or a current transformer for current measurement in a range of 0 A to 500 A.

3. The measuring unit according to claim 1, wherein the first, second and third two-pole electrical interconnections are rigid electrical conductive rods or slabs.

4. The measuring unit according to claim 1, the unit being further configured and arranged to be powered directly from the high-voltage line and/or powered by a magnetic field and/or powered by an internal power source.

5. The measuring unit according to claim 1, wherein:
the first voltage sensor, the second voltage sensor, the first current sensor and second current sensor are comprised in a high-voltage circuit; and the unit further comprises:
a low-voltage circuit, coupled to the high-voltage circuit, such that the two current values are detectable by the low-voltage circuit and the low-voltage circuit is powered by the high-voltage circuit.

6. The measuring unit according to claim 1, wherein the measuring unit further comprises a data communications interface for radio and/or galvanically separated communication with a base station.

7. The measuring unit according to claim 1, the unit further comprising a third current sensor, configured and arranged to measure a current through the second interconnection, wherein the third current sensor is a shunt sensor for current measurement in a range of 0 A to 200 A, a Hall sensor for current measurement in a range of 0 A to 1000 A, a Rogowski coil current sensor for current measurement in a range of 0 A to 100 kA, or a current transformer for current measurement in a range of 0 A to 500 A.

8. The measuring unit according to claim 1, wherein the unit comprises at least one Hall sensor, configured and arranged as a current sensor for current measurement in the range 5 A to 1000 A.

9. The measuring unit according to claim 1, the unit further configured and arranged to detect and indicate faults and/or a short circuit in at least one high-voltage conductor.

10. The measuring unit according to claim 1, further configured and arranged to generate an interrupt signal in case of a fault indication, the interrupt signal being configured and arranged to trigger a safety relay, the safety relay being configured and arranged to interrupt a flow of electrical energy to at least one high-voltage conductor.

11. The measuring unit according to claim 1, configured and arranged to measure reactive currents and/or reactive power and/or harmonics of at least one high-voltage conductor.

12. The measuring unit according to claim 1, wherein the unit comprises a waveform extracting module.

13. The measuring unit according to claim 12, wherein the waveform extracting module is configured for power quality analyzing.

14. The measuring unit according to claim 12, wherein the waveform extracting module is configured for detecting and characterizing a ground fault, a phase-to-phase fault and/or any type of waveform distortion.

15. The measuring unit according to claim 12, wherein the waveform extracting module is configured for localizing the detected event within the network.

* * * * *